United States Patent [19]

Lewis et al.

[11] Patent Number: 5,255,383
[45] Date of Patent: Oct. 19, 1993

[54] METHOD AND APPARATUS FOR SKEWING A MEMORY READ CLOCK SIGNAL IN A MAGNETIC DISK DRIVE SYSTEM

[75] Inventors: David M. Lewis, Santa Cruz, Calif.; Nimesh Parikh, Gruenwald, Fed. Rep. of Germany

[73] Assignees: Seagate Technology, Inc., Scotts Valley, Calif.; AT&T Company, New York, N.Y.

[21] Appl. No.: 686,113

[22] Filed: Apr. 15, 1991

[51] Int. Cl.[5] ............................................. G06F 12/02
[52] U.S. Cl. .................................. 395/425; 395/550; 364/DIG. 1
[58] Field of Search ................ 395/425, 550; 365/233, 365/194, 189.05; 364/200 MS, 900 MS

[56] References Cited

U.S. PATENT DOCUMENTS

| | | | |
|---|---|---|---|
| 4,901,226 | 2/1990 | Barlow | 364/DIG. 1 |
| 4,949,249 | 8/1990 | Lefsky et al. | 395/550 |
| 5,113,500 | 5/1992 | Talbott et al. | 364/DIG. 1 |

Primary Examiner—Joseph L. Dixon
Assistant Examiner—David L. Robertson
Attorney, Agent, or Firm—Flehr, Hohbach, Test, Albritton & Herbert

[57] ABSTRACT

A method and a system for providing a skewed clock signal which is used for latching a data signal received from a memory into a read-data latch. A control signal latch and a control-signal buffer provide a control sign to the memory. A read-data buffer feeds a data signal from the memory to a read-data latch, which is provided with skewed read-clock signal. A read-clock delay circuit provides a clock signal to the read-data latch, and delays the read clock signal a period of time approximately equal to the signal propagation delay time of the read data buffer and the propagation delay time associated with transmitting a signal from the output terminal of said control signal latch circuit to the control-signal input terminal of the memory.

14 Claims, 6 Drawing Sheets

METHOD AND APPARATUS FOR SKEWING A MEMORY READ CLOCK SIGNAL IN A MAGNETIC DISK DRIVE SYSTEM

BACKGROUND OF THE INVENTION

1. Field of the Invention

This invention relates to electronic memories and, more particularly, to systems which provide clock signals for reading from said memories.

2. Prior Art

When data is read out of an external electronic memory device, such as for example a dynamic random access memory DRAM, the data is retrieved from the memory core cells and is made available to a user's utilization device only after certain propagation-time delays, which are within the memory device and which are within a user's circuits, have elapsed. Electronic memory devices themselves, such as DRAMS, typically are specified by their manufacturers to have the same access delay time for both a read mode of operation and for a write mode of operation. However, the user's associated circuitry often adds more additional delay to an operation in which the memory is read by the user, in comparison to an operation in which the memory is written by the user. The reason for the unequal delays is that the user in the memory-read mode must not only send signals to the memory (similar to the write mode) but must also receive signals back from the memory, where receipt of the read signals involves additional propagation delays.

Some of the user's propagation delays are the propagation delays for a column-address-strobe CAS signal generated by user to strobe the column address of a previously selected row of information in a memory, where the memory is organized and addressed by row and column address signals. The CAS signal is held in a latching flip-flop, which typically has a small amount of propagation delay. The output signal of the latching flip-flop passes through a CAS-buffer to the CAS input terminal of the electronic memory device. The CAS buffer typically has a greater amount of propagation delay than the latching flip-flop.

Where the CAS signal does not change for every column address, as in a static-column DRAM, the column address signals have propagation delays which must be accounted for as they pass through a user's address circuits.

Another propagation delay is the access time required for memory cell information to appear at the memory output terminals after a particular memory cell is addressed. The user has no control over the memory access-time delay, which is specified by a manufacturer for a particular memory device.

Other user's delays also include the propagation delay through a buffer for receiving the memory output data, which has a relatively large amount of propagation delay, and the propagation delay through a user's read data-latching flip-flop.

In practice, the propagation delays through a user's buffer circuits also depends on variations in the impedance loading, such as capacitance loading, on the various signal lines within a user's application system. Consequently, means (such as fixed delay lines) for providing fixed propagation delays to compensate in some way for propagation delays through a user's buffer circuits, may not simply and adequately provide sufficient delay compensation.

In a write mode of operation, the propagation delays of the various control signals are required to be equal in order to have a cycle time which is equal to the write cycle time of the memory. On the other hand, in a read mode of operation, delays in addition to the memory access time, as described hereinabove, must be accounted for.

SUMMARY OF THE INVENTION

It is therefore an object of the invention to provide a method and apparatus for compensating for propagation delays introduced by a user's memory buffer circuits.

It is another object of the invention to provide for compensation in variable propagation delays caused by variable impedance loading on the signal interconnect transmission lines in a user's system.

The invention has definite advantages for use with a buffer memory used in connection with a controller such as a small systems computer interface (SCSI) controller, which controls a hard-disk magnetic storage device. This scheme is also advantageously used in any system where multiple data streams are being read from a DRAM. Such systems include, for example, hard-disk magnetic storage device controllers and a cache controller which loads a cache line from a main memory.

In accordance with these and other objects and advantages of the invention, a method and a system are provided according to the invention for providing a skewed clock signal, which is used for latching a data signal received from a memory into a read-data latch. Essentially the invention provides a skewed, or delayed, clock signal for a memory-output read-data latch. The clock signal is delayed for a period of time approximately equal to the sum of the signal propagation time of a read-data buffer at the memory-output and the signal propagation time for the various control signals of the memory. In one embodiment of the invention, the memory, for example, includes a dynamic random access memory DRAM. The memory has a control-signal input terminal and a data output terminal. The invention includes a control signal latch means, having a clock input terminal for receiving a read clock signal from a read-clock source, having an input terminal for receiving a control-signal, and having an output terminal, for latching the control signal at an output terminal thereof. A control-signal buffer is also provided which has an input terminal coupled to the output terminal of the control signal latch means and which has an output terminal coupled to the control-signal input terminal of the memory. A read-data buffer is provided which has an input terminal coupled to the data output terminal of the memory and which has an output terminal. The read data buffer has a signal propagation delay. An important element of the invention is a sense buffer, which has an input terminal coupled to the output terminal of the control-signal buffer and which has an output terminal, where the sense buffer has a signal propagation delay approximately matching the signal propagation delay of the read-data buffer. A read-data latch has a data input terminal coupled to the data output terminal of the read-data buffer, an output terminal and a clock input terminal, for latching data signals received from said memory. A read-clock delay means is provided, which has one input terminal coupled to the output terminal of said control signal latch means and which has another input terminal coupled to the output terminal of the sense buffer. An output terminal is coupled to the clock input terminal of the read-data latch, for delaying the read clock signal a period of time approximately equal to the signal propagation delay time of the read data buffer plus the propagation delay time associated with transmitting a signal from the output terminal of said control signal latch means to the control-signal input terminal of the memory.

According to one aspect of the invention, the read-clock delay means includes equality-detection means for comparing the output signal of the control-signal latch means with the output signal of the sense buffer and for providing a read-clock signal to the clock input terminal of the read-data latch means when the output signal of the control-signal latch means and the output signals of the sense buffer are at the same state. The equality-detection means includes exclusive-nor logic means for comparing the output signal of the control-signal latch means with the output signal of the sense buffer.

According to another aspect of the invention, the system includes a plurality of control signal latch means, control-signal buffers, and sense buffers for accommodating a plurality of control signals for the memory. A plurality of read-data buffers and read-data latch means are provided for accommodating a plurality of data output terminals for the memory. The memory is, for example, a dynamic random access memory and said control signal is a column address strobe (CAS) signal.

An important aspect of the invention provides for incorporating the skewing of the memory read clock signal into a controller for interfacing between a magnetic disk-drive memory device and a host computer. A buffer memory subsystem is provided which includes a buffer memory and a clock system for skewing the memory-read clock signal used for latching a memory data signal into a read-data latch in the controller. The buffer memory device includes a dynamic random access memory, having control-signal input terminals and data-signal output terminals.

According to the invention, a method is provided for skewing the memory-read clock signal which is used for latching the memory data signal into the read-data latch. The memory data signal is received from a memory device having a control-signal input terminal and data-signal output terminal. The method includes the steps of: passing a control signal through a control-signal buffer and specifically an input terminal thereof, the buffer having an output terminal coupled to the control-signal input terminal of said memory device; passing a memory data signal through a read-data buffer which has an input terminal coupled to the data-signal output terminal of said memory device; latching the output signal of said read-data buffer in a read-data latch which has a data input terminal coupled to the output terminal of said read-data buffer, an output terminal, and a clock input terminal; passing the output signal of the control-signal buffer through a sense buffer which has an input terminal coupled to the output terminal of the control-signal buffer and an output terminal; comparing the output signals of the control-signal latch with the output signal of the sense buffer, and providing a read-memory clock output signal for the read-data latch when the output signal of the control-signal latch means and the output signal of the sense buffers are at the same state. The read-memory clock output signal is thereby skewed for a time corresponding to the propagation delay time through the control-signal buffer and the read-data input buffer. The method further includes the step of latching an input control signal in a control-signal latch means which has a clock input terminal for receiving a read clock signal from a read-clock source, an input terminal for receiving a control-signal, and an output terminal at which is provided a latched control signal.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a timing diagram showing the relationship between a user clock signal and a skewed read-data clock signal, provided according to the invention, in which various user system functions can be overlapped in time to decrease the net memory access time for a user system;

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
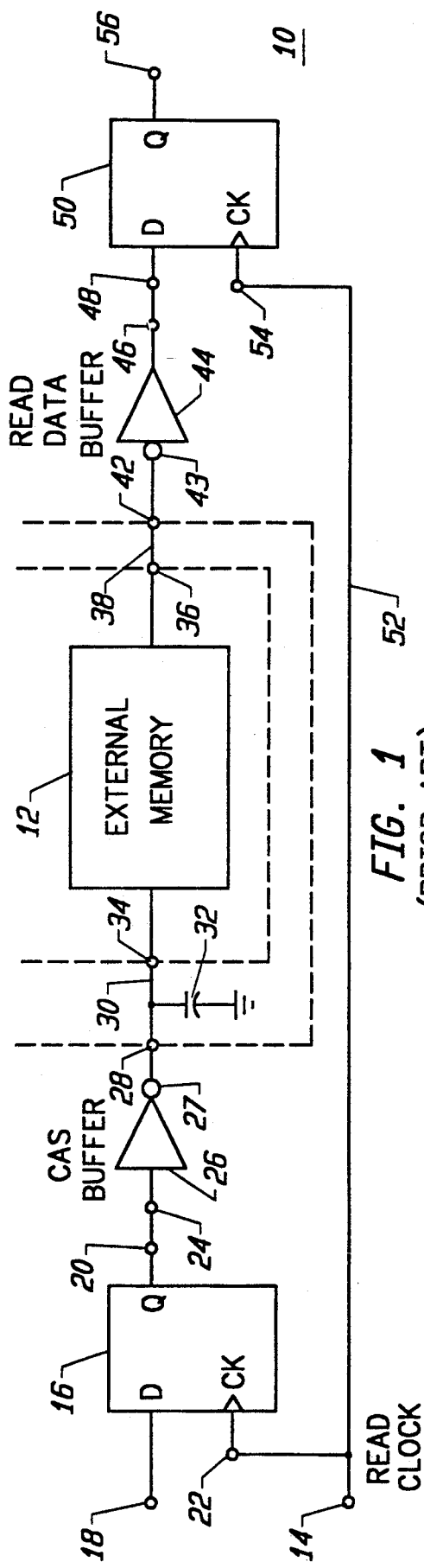
FIG. 1 is a schematic diagram of a prior art system for clocking internal buffers and flip-flops used with an electronic memory in a read mode of operation.

FIG. 1 is a schematic diagram of a conventional, prior art integrated-circuit system 10 for providing one of a plurality of timing signals to an external electronic memory 12, such as a dynamic random access memory (DRAM). The various circuit components for the timing signals are typically part of one integrated circuit, while the memory 12 circuits are implemented with one or more external DRAM integrated circuits. The timing signals for a DRAM typically include, for example, column access select CAS signals and various address signals, typically designated as A0 through A8.

FIG. 1 shows a typical arrangement for handling a CAS signal. A read clock from the user system is provided at an input terminal 14. A CAS flip-flop 16, which is a positive-edge triggered D flip-flop, latches a CAS signal provided at a D input terminal 18 to a Q output terminal 20 on the positive going edge of the read clock, which is provided to the clock input terminal 22. The Q output terminal 20 is coupled to an input terminal 24 of a CAS buffer 26.

The output terminal 27 of the CAS buffer is connected to an associated lead bonding pad 28 of an integrated circuit. A bonding pad is conventionally used to make external connection to an integrated circuit. Bonding pads for an integrated circuit often have input and output driver amplifiers, or buffers, associated therewith. In this case, the bonding pad 28 is connected to a signal line 30, which is external to the user circuit 10. A capacitor 32 is shown in the figure to represent distributed capacitance for the signal line 30, which capacitance loads the output terminal 28 of the CAS buffer 26 and affects the propagation delay time. The capacitance 32 for the signal line 30 varies as a function of length and placement such that the propagation delay time of the CAS buffer 26 varies. However, the prior art circuit of FIG. 1 is used with the assumption that the propagation delay time of the CAS buffer 26 is fixed. The signal line 30 is connected to a CAS signal input terminal 34 of the external memory 12.

The output terminal 36 of the external memory 12 is connected through a signal line 38 to a lead bonding pad 42 of the integrated circuit, which is connected to an input terminal 43 of a read data buffer 44. The output terminal 46 of the read data buffer 44 is coupled to a D input terminal 48 of a D flip-flop 50. The read clock signal as provided on input terminal 14 is coupled through a signal line 52 to a clock input terminal 54 of the D flip-flop 50. Memory data appearing at the D input terminal 48 of the flip-flop D is transferred to the Q output terminal 56 on the positive-going edge of the read clock at terminal 54.

Figure 2:
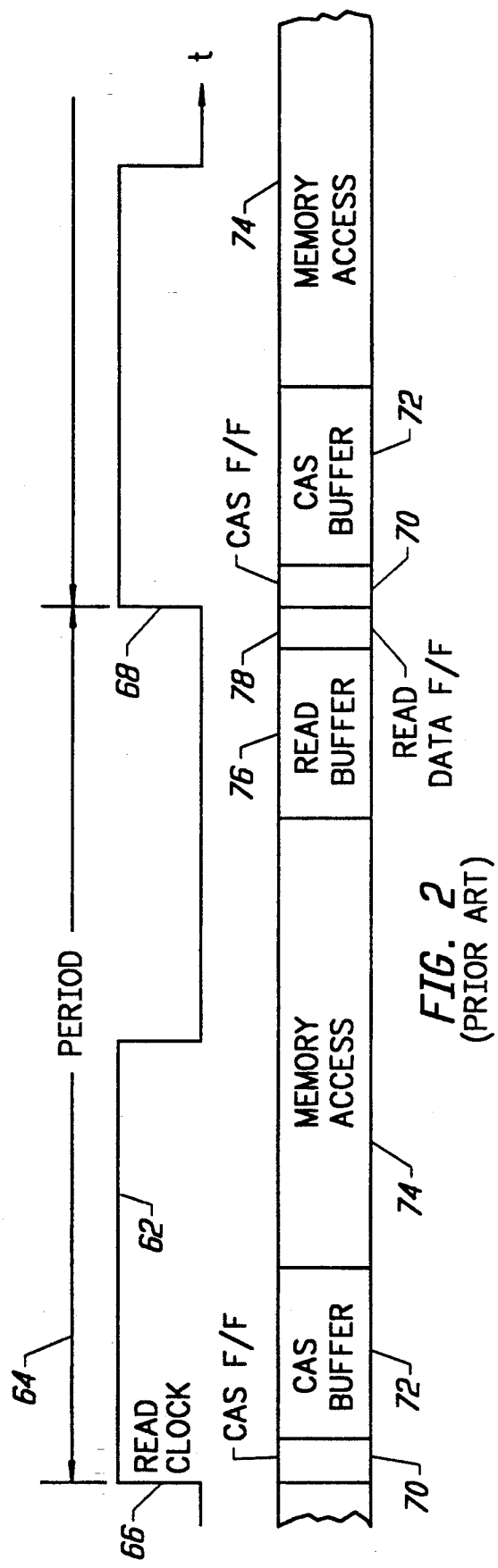
FIG. 2 is a chart illustrating the sequential timing relationship between various propagation delays associated with the prior art read-memory clocking system shown in FIG. 1.

FIG. 2 is a timing diagram of the read clock signal 62 provided at the read clock terminal 14 of FIG. 1. The read clock signal 62 has a period 64 as shown in the drawings. In order for information to be read from the external DRAM 12, several events must occur: A CAS control signal provided at input terminal 18 propagates through the flip-flop 16, the CAS buffer 26, and out through the pad 28. The external DRAM 12 performs a read operation. The resultant data output propagates from the DRAM 12 through the pad 42 and through the read data buffer 44 to the input terminal 48 of the read data flip-flop 50. The setup time for the read data flip-flop 50 is relatively small in comparison to the other delay times. In a fully synchronous system, all of these events must occur within one clock cycle.

In FIG. 2, the propagation delays associated with the various circuit elements shown in FIG. 1 are indicated below the waveform for the read clock 62. Note that the flip-flops 16,50 are triggered on the rising edges 66,68 of the read clock 62 as shown. The CAS flip-flop 16 has a short propagation delay 70 until an output signal appears at the Q output terminal 20. The signal propagates through the CAS buffer 26 with a CAS buffer propagation delay 72. Note that the CAS buffer delay 72 is variable due to the loading on the output pad 28 caused by variation in the capacitance 32 of the signal line 30. The CAS select signal provided on input terminal 34 of the external memory 12 causes an output signal from the external memory to appear at terminal 36 after a memory access propagation delay 74. The data signal coming from the external memory appears at the input pad 42 and then passes through the read buffer 44 to arrive at the output terminal 46 of the read data buffer 44, which has a read data buffer propagation delay 76, as shown in FIG. 2. Finally, the read data flip-flop 50 has a propagation delay associated therewith as indicated by the read data flip-flop delay 78 as shown in FIG. 2.

For the prior art configuration of FIG. 1, the clock period 64 of the read clock 62 is set for worst-case propagation delays through the CAS buffer 26, the external memory 12, and the read data buffer 44. These delays must also include the effect of the capacitance 32. The straightforward prior art approach to accommodate these delays and variations thereof is to extend the period 64 of the read clock 62 to the longest, worst-case time contemplated. This will permit the CAS selection with the resultant selection of a memory location and the output of the data therein to be handled under all conditions. However, this does require the memory access read clock 62 to be operated at a slower than optimum rate, slowing down the overall operation time of the user circuit.

Figure 3:
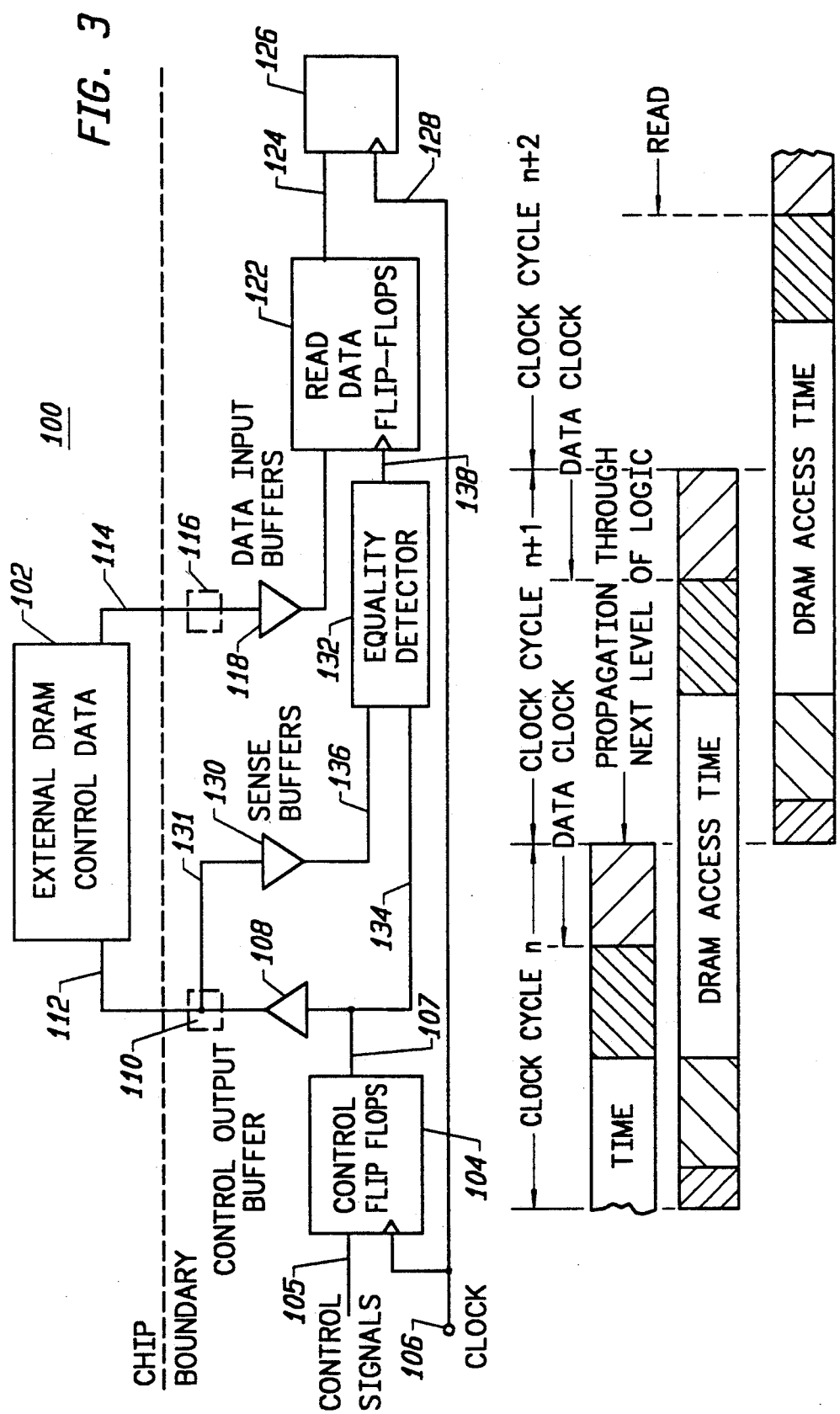
FIG. 3 is a simplified schematic diagram for a read clocking system, according to the invention, for clocking a memory-read flip-flop with a skewed clock signal automatically skewed to account for various propagation delays according to the invention.
Figure 4:
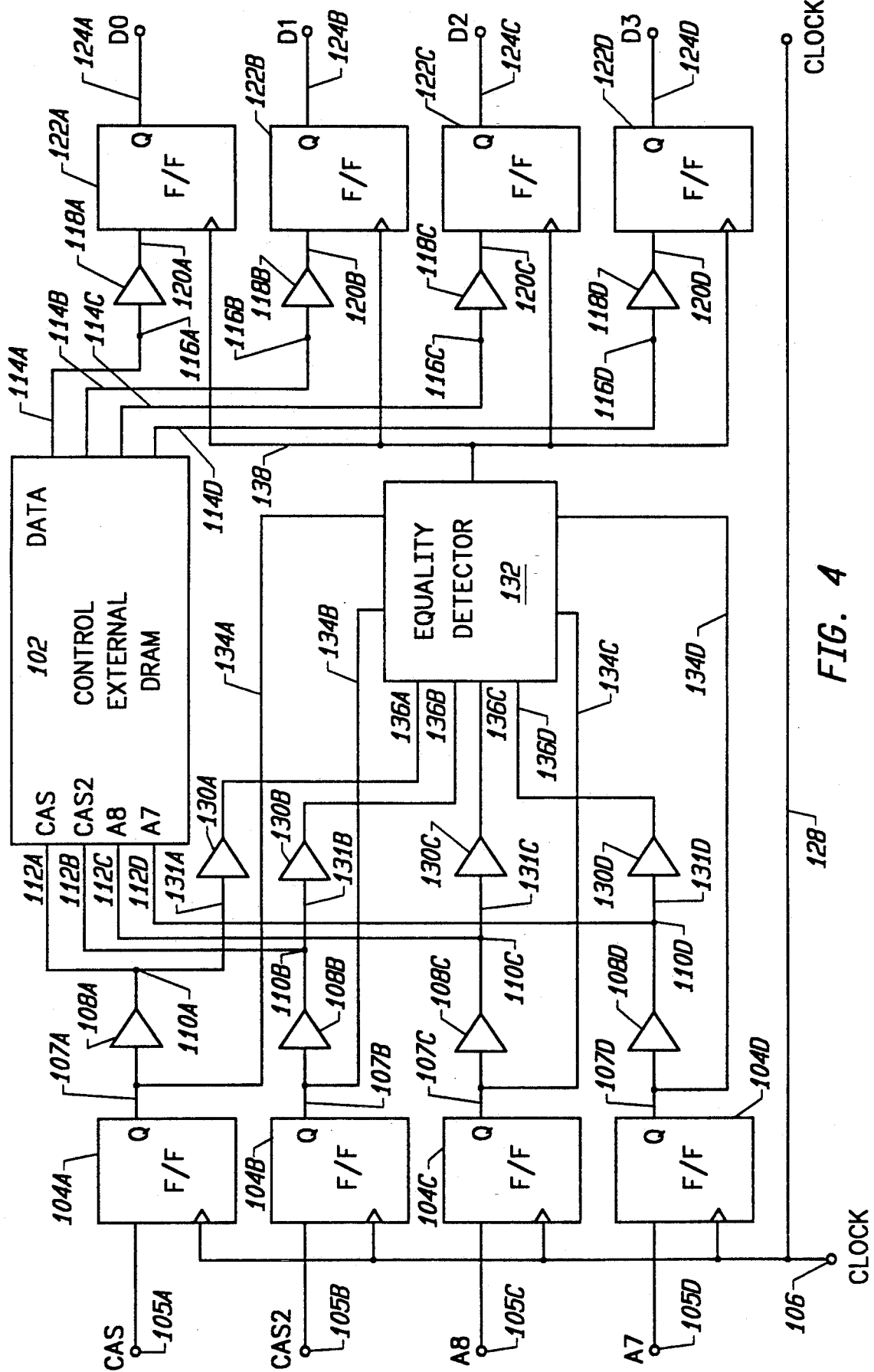
FIG. 4 is a more detailed schematic diagram for the read clocking system of FIG. 3.

FIG. 3 is a simplified schematic diagram of a clocking system 100 for clocking the read operation of an external DRAM 102, according to the invention. More specific details for FIG. 3 are shown in FIG. 4, which is described hereinbelow. Block 104 represents a number of control flip-flops, similar to the CAS flip-flop of FIG. 1. Each of the control flip-flops, which are collectively represented by the block 104 is clocked by a system clock signal provided at a clock input terminal 106. The input control signals are provided to the respective control flip-flops on signal lines contained in a bus 105. The output terminals of each of the control flip-flops are connected by a signal line, which is part of a bus 107, to the input terminals of a block 108. The block 108 is labeled as Control Output Buffers and represents a number of buffer amplifiers, similar to the CAS buffer 26 of FIG. 1. Each of the signal lines of the bus 107 terminates at an input terminal of one of those buffers. A number of lead bonding pads are collectively represented by a dotted block 110. Each of these bonding pads is associated with an output terminal of one of the buffer amplifiers of the block 108. Each of the bonding pads are connected by one of a group of signal lines, collectively represented by the bus 112, to the control input terminals of the external DRAM 102. The data output signals A0–A3 from the external DRAM 102 output terminals are fed on signal lines collectively represented by the bus 114 to respective input bonding pads, which are collectively represented by a dotted block 116. These pads are connected to various data input buffers, which are collectively represented by the block 118 labeled Data Input Buffers. The output terminals of these buffers are connected through signal lines, collectively represented by a bus 120, to the input terminals of a block 122, labeled Read Data Flip-Flops. The block 122 collectively represents a number of read data flip-flops, one for each of the data signal lines. The output terminals of the read data flop-flops are fed through a bus 124 to a user block 126 which represents various internal circuits within a user's system. Clocking of the internal circuits within the block 126 is performed with a clock signal provided on signal line 128 which is connected to the clock input terminal 106.

The system, which is shown in simplified form in FIG. 3, provides for clocking the memory-read-data flip-flops, represented by block 122, with a clock signal which is automatically skewed to account for various propagation delays. In analyzing the amount of skew needed for the read data clock, it is seen that the skew needed is equal to the sum of the propagation delays for one of the control flip-flops, a control pad, and a data input pad, plus the setup time for a data flip-flop. The setup time for the data flip-flop is quite small in comparison with the pad delays and can safely be ignored. A complicating factor is that the capacitance associated with the DRAM control pins, and the variable delay associated therewith, varies greatly with the layout of a circuit board and with the number and kind of DRAMs used. Because of these variations, a fixed delay is not a good design choice, even where the delays may track the variations in an integrated-circuit fabrication process.

The scheme according to the invention provides for skewing of the clocking signals for the read data flip-flops, collectively represented by block 122. The invention utilizes a pair of buffers connected to each of the integrated-circuit bonding pads 110. One of these buffers is from the group of control output buffers 108. The other buffer is from a group of sense input buffers, collectively represented by the block 130. The input terminals of the sense input buffers are connected to the pads 110 with signal lines which are part of a bus 131. A control buffer and a sense buffer may be part of the input/output I/O drivers which are associated with a particular output pin of an integrated circuit. For purpose of this instant invention, certain ones of these I/O buffer pairs are always enabled. These buffers pairs includes, for example, the CAS, CAS2, A8, and A7 lines. One of the signals for these lines is guaranteed to change at the end of each clock cycle. The assumption is made that all of the output pads for the address bits have the same delay, and that the delays through the sense pads for CAS, CAS2, A8, and A7 are each equal to or slightly less than the delay through the data input pads.

An equality circuit 132 receives on the bus 134 certain ones of the internal control signals, such as CAS, CAS2, A8, A7 from the control flip-flops of the block 104. The signal bus 136 provides the equality circuit 132 with external signals corresponding to these internal control signals. The signals on the bus 136 are delayed through the sense buffers of block 130. The delays corresponds to the delay of the data input buffers in the block 118. The variable delay caused by the capacitances in the signal lines of the bus 112 are also accounted for. The equality circuit 132 provides a read data clock on a signal line 138 to the clock input terminal of the read data flip-flops represented by the block 122. The equality detector 132 holds the read data clock on signal line 138 in a FALSE state when the internal control signals on bus 134 are not in the same state as the external control signals as seen through the sense buffers. The read data clock on signal line 138 is brought to a TRUE state when the internal control signals and the external control signals come back into congruence. Transition from FALSE to TRUE triggers to read data flip-flops. The invention thus provides a skewed clock. This accounts for delays in all of the control signals, including capacitance effects, before the read data flip-flops are triggered.

FIG. 4 is a more detailed block diagram of the clocking scheme of FIG. 3. The system clock is provided from input terminal 106 to the clock input terminals of the CAS control flip-flop 104A, the CAS2 control flip-flop 104B, the A8 control flip-flop 104C, and the A7 control flip-flop 104D.

The Q output terminal of the CAS flip-flop 104A is coupled through a signal line 107A to an input terminal of a CAS control output buffer 108A. The Q output terminal of the CAS2 flip-flop 104B is coupled through a signal line 107B to an input terminal of a CAS2 control output buffer 108B. The Q output terminal of the A8 flip-flop 104C is coupled through a signal line 107C to an input terminal of a A8 control output buffer 108C. The Q output terminal of the A7 flip-flop 104D is coupled through a signal line 107D to an input terminal of a A7 control output buffer 108D.

The output terminal of the CAS control output buffer 108A is connected to a bonding pad 110A. The pad 110A is connected through a signal line 112A to the CAS input terminal of the external DRAM 102. The pad 110A is connected through a signal line 131A to an input terminal of a CAS sense buffer 130A. The output terminal of the CAS2 control output buffer 108B is connected to a bonding pad 110B. The pad 110B is connected through a signal line 112B to the CAS2 input terminal of the external DRAM 102. The pad 110B is connected through a signal line 131B to an input terminal of a CAS2 sense buffer 130B. The output terminal of the A8 control output buffer 108C is connected to a bonding pad 110C. The pad 110C is connected through a signal line 112C to the A8 input terminal of the external DRAM 102. The pad 110C is connected through a signal line 131C to an input terminal of a A8 sense buffer 130C. The output terminal of the A7 control output buffer 105D is connected to a bonding pad 110D. The pad 110D is connected through a signal line 112D to the A7 input terminal of the external DRAM 102. The pad 110D is connected through a signal line 131D to an input terminal of a A7 sense buffer 130D.

The output terminal of the CAS control flip-flop 104A is connected through a signal line 134A to an input terminal of the equality detector 132, while the output terminal of the CAS sense buffer 130A is connected through a signal line 136A to a corresponding input terminal of the equality detector 132. The output terminal of the CAS2 control flip-flop 104B is connected through a signal line 134D to an input terminal of the equality detector 132, while the output terminal of the CAS sense buffer 130A is connected through a signal line 136B to a corresponding input terminal of the equality detector 132. The output terminal of the A8 control flip-flop 104C is connected through a signal line 134C to an input terminal of the equality detector 132, while the output terminal of the A8 sense buffer 130C is connected through a signal line 136C to a corresponding input terminal of the equality detector 132. The output terminal of the A7 control flip-flop 104D is connected through a signal line 134D to an input terminal of the equality detector 132, while the output terminal of the A7 sense buffer 130D is connected through a signal line 136D to a corresponding input terminal of the equality detector 132.

The delayed clock output signal of signal line 138 is fed to the clock input terminals of the A0-A3 data flip-flops 122A-D, which provide latched data output bits D0 through D3 to the user's utilization circuits. Data input to the data flip-flops is obtained from the respective data input buffers 118 on respective signal lines 120-A-D.

Some of the read activities can be overlapped as long as at the pads 110,116 the control signals do not change more often than the DRAM 102 access time. If the control signals do not change more often than the DRAM access time, valid data signals will appear at the end of the delay time and will begin propagating through the data input pads 116. If the clock signal which latches the data into the read data flip-flops 122 does not change more often than the DRAM access time, valid data from the DRAM will appear at the end of the access-time delay and will begin propagating through the data input pads 116. If the clock signal which latches the data into the read data flip-flops 122 is appropriately skewed, the clock cycle can be reduced to the DRAM access time plus a small margin.

FIG. 5 shows that, using the circuit of FIG. 4, a new, skewed read clock signal can be used to reduce the time required for a system to access memory data. The period of the prior art read clock shown in FIG. 2 is somewhat greater than the sum of the time delays for the CAS buffer, the memory access, and the read buffer. As shown in FIG. 5, the system according to the invention provides for a skewed read clock which has a shorter period than the prior art read clock 62. The period of the skewed read clock is slightly greater than the memory access time delay. With the shortened read clock, certain functions can be overlapped once the CAS signal starts propagating through the circuit. For the Nth clock the read buffer is activated. For the (N+1) the clock the memory access is propagating. For the (N+2)th clock the clock signal is propagating through the CAS buffer. With this overlapping of functions as shown in FIG. 51 the new read clock can have a shorter period than the prior art read clock.

Figure 6:
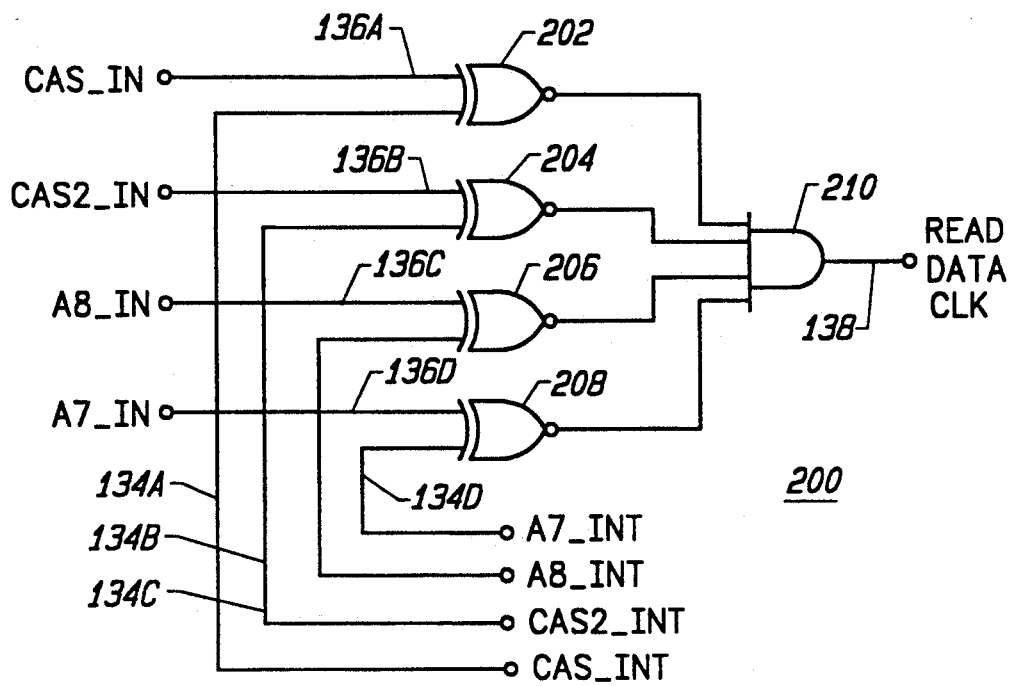
FIG. 6 is a schematic diagram of one embodiment of an equality detector for generating a skewed read data clock signal using CAS, CAS2, A7 and A8 signals.

FIG. 6 shows a schematic diagram of one embodiment of an equality detector 200 for use in the circuit of FIGS. 3 and 4. This detector includes means for comparing delayed and non-delayed versions of various control signals to provide a skewed clock signal for the read data flip-flops. The detector includes means for comparing a delayed and non-delayed version of the A8 and A7 control bits for the case in which a static-column DRAM memory is used and where the CAS control signal does not change. However, either the A7 address bit or the A8 address bit is changed for every read-out operation for static-column 256K bit and 1M bit DRAMS. A delayed CAS signal CAS_IN on signal line 136A is compared with a non-delayed CAS signal on signal line 134A by an exclusive-nor gate 202. A delayed CAS2 signal CAS2_IN on signal line 136B is compared with a non-delayed CAS2 signal on signal line 134B by an exclusive-nor gate 204. A delayed A8 signal A8_IN on signal line 136C is compared with a non-delayed A8 signal on signal line 134C by an exclusive-nor gate 204. A delayed A7 signal A7_IN on signal line 136D is compared with a non-delayed A7 signal on signal line 134D by an exclusive-nor gate 205. The output terminals of the exclusive-nor gates 202,204,206,208 are connected to respective input terminals of a 4-input and gate 210. The output terminal provides the skewed clock signal on signal line 138 to the user utilization circuits when all of the delayed signals match the non-delayed signals.

Figure 7:
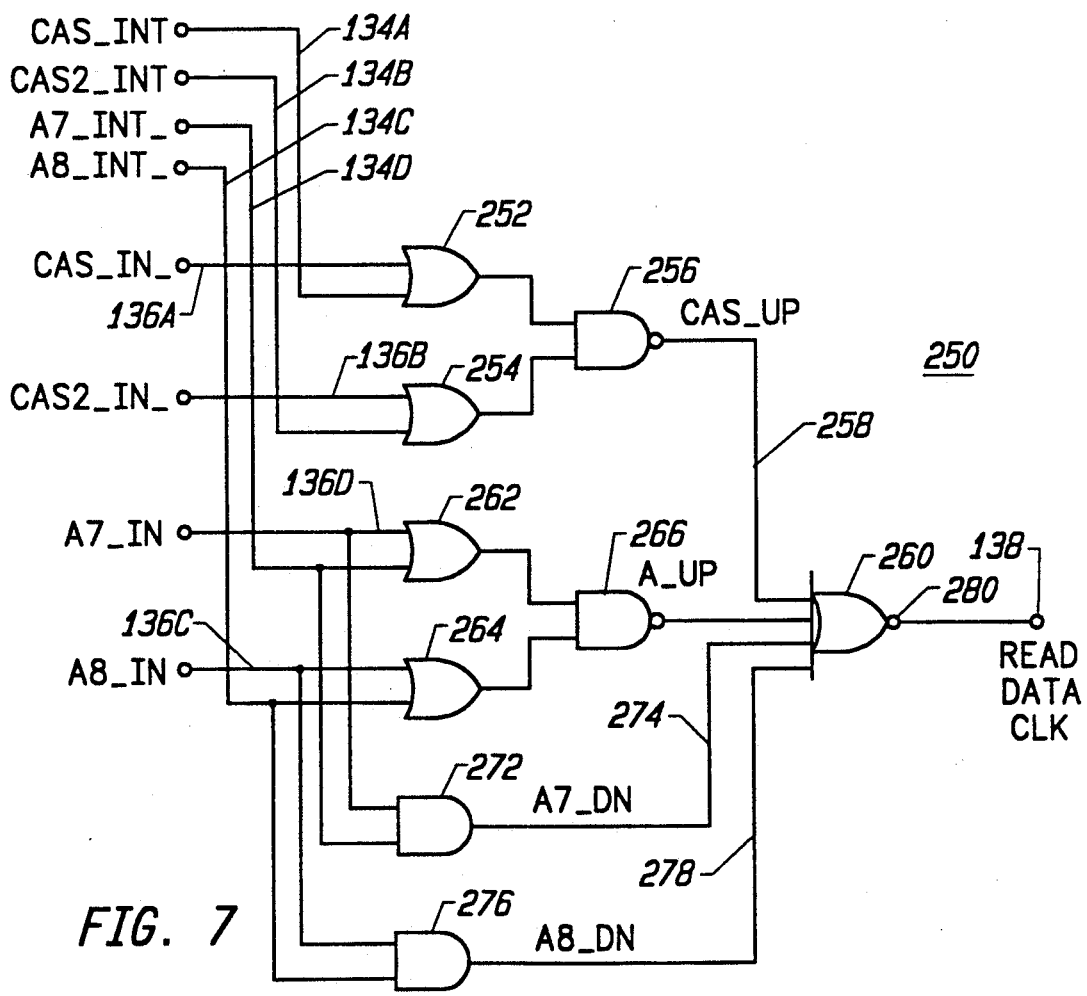
FIG. 7 is a schematic diagram of another embodiment of an equality detector.

FIG. 7 shows a schematic diagram of another embodiment of an equality detector 200 for use in the circuit of FIGS. 3 and 4. Means are provided for comparing delayed and non-delayed versions of various control signals to provide a skewed clock signal for the read data flip-flops. The detector includes means for comparing a delayed and non-delayed version of the A8 and A7 control bits for the case in which a static-column DRAM memory is used and where the CAS control signal does not change. However, either the A7 address bit or the A8 address bit is changed for every read-out operation for static-column 256K bit and 1M bit DRAMS.

A delayed CAS signal CAS_IN on signal line 136A and a non-delayed CAS signal CAS_INT on signal line 134A are fed to respective input terminals of an or-gate 252. A delayed CAS2 signal CAS2_IN on signal line 136B and a non-delayed CAS2 signal on signal line 134B are fed to respective input terminals of an or-gate 254. The output terminals of the or-gates 252,254 are connected to the input terminals of a nand-gate 256, the output of which provides a signal CAS_UP on signal line 255, indicating a change in the CAS or CAS2 signals. Signal line 258 is connected to one input terminal of a nor-gate 260.

Similarly, a delayed A8 signal A8_IN on signal line 36C and a non-delayed A8 signal A8_INT on signal line 134C are fed to the input terminals of an or-gate 264. A delayed A7 signal A7_IN on signal line 136D and a non-delayed A7 signal A7_INT on signal line 134D are fed to the input terminals of an or-gate 262. The output terminals of the or-gates 262,264 are connected to the input terminals of a nand-gate 266, the output of which provides a signal A_UP on signal line 265 indicating a positive going change in the A7 or A8 signals. Signal line 268 is connected to an input terminal of the nor-gate 260. An and-gate 272 compares the delayed and non-delayed A7 signals and provides an output signal A7_DN on signal line 274 to an input terminal of the nor-gate 260. An and-gate 276 compares the delayed and non-delayed A8 signals and provides an output signal A8_DN on signal line 278 to an input terminal of the nor-gate 260. The output terminal 280 of the nor-gate 260 provides the skewed clock signal on signal line 138 of FIGS. 3 and 4 to the user utilization circuits.

Figure 8:
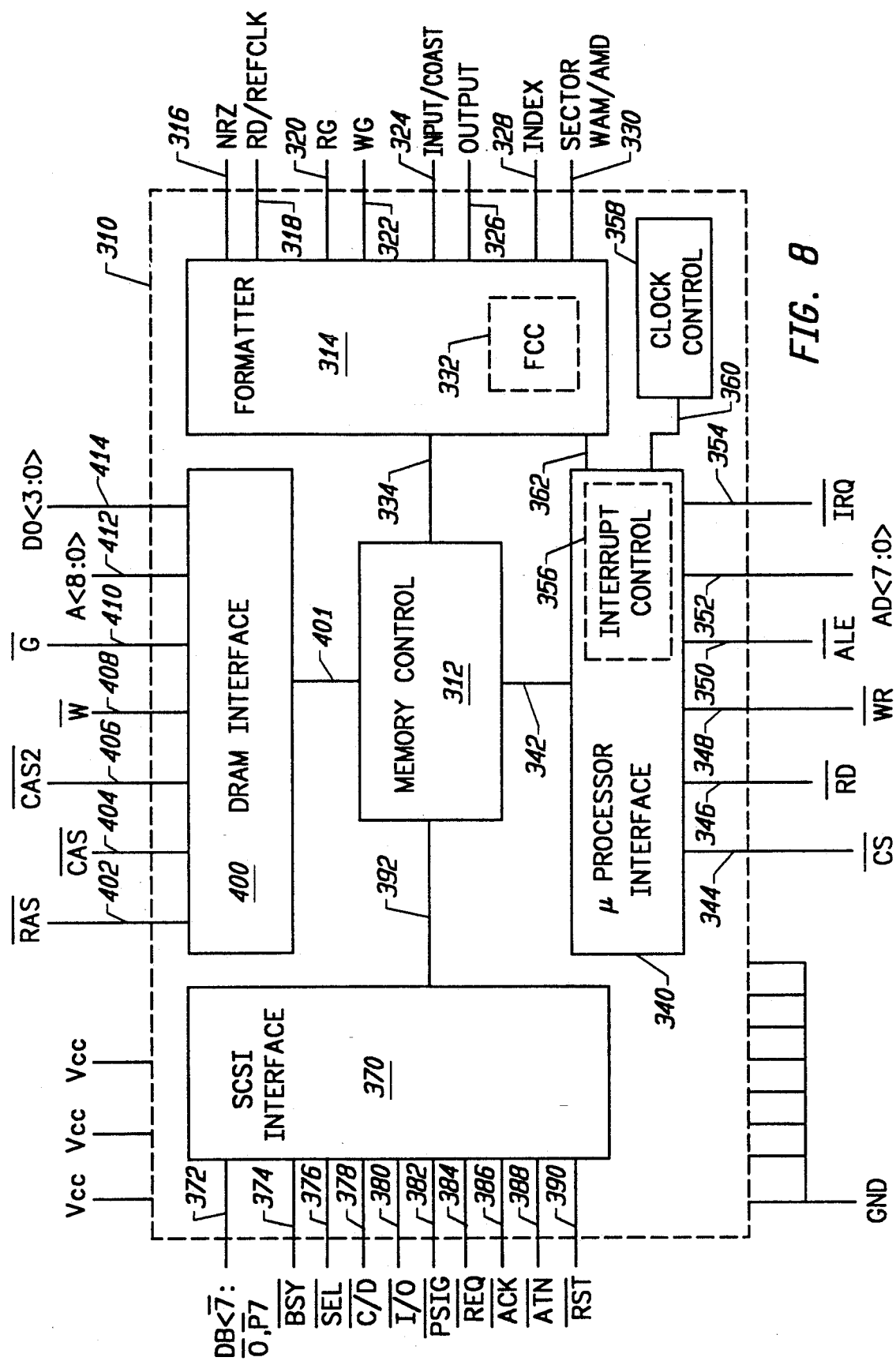
FIG. 8 is a block diagram of the principle elements of a SCSI controller for interfacing between a host computer and a hard disk magnetic storage device.

FIG. 8 is a block diagram of the principle elements of a small computer system interface SCSI controller 310 for interfacing between a host computer and a hard disk magnetic storage device. The SCSI controller is provided as a 68-pin integrated circuit. As shown in the diagram, various interfaces are connected by signal buses to a memory control unit 312. A formatter block 314 provides an interface to a magnetic storage disc through various signal lines. The NRZ signal on line 316 is an input/output signal in an NRZ data format which provides a data bit stream to or from the logic in the formatter 314. The RD/REF CLK signal on line 318 is a read reference clock which is the clock signal for the formatter supplied by the data separator of the magnetic disc electronics. The frequency of this clock signal ranges from 5 Mhz to 24 Mhz. The read gate signal RG on signal line 320 is a signal which enables the read channel and causes the controller circuit 310 to input NRZ data from the magnetic disc. The write gate signal WG is a signal which enables the write drivers and causes the controller circuit 310 to output NRZ data to the magnetic disc. The INPUT/COAST signal on line 324 and the OUTPUT signal on line 326 are signals which are general purpose signals used to synchronize the formatter 314 with external hardware. The INDEX signal on line 328 is a signal which is the index signal from the magnetic disc drive and is supplied once per revolution of the disc. The SECTOR/WAM/AMD signal on line 330 is a sector input, address mark detected input, or write address mark output to or from the formatter 314, depending on the operating mode of the system. The formatter 314 also contains an error correction code circuit ECC 332. Signals passing between the memory control unit 312 and the formatter 314 are carried on a signal bus 334.

Interfacing between the memory control unit 312 and an external microprocessor such as an 8051 Intel Controller is handled with a microprocessor interface circuit 340 which communicates with the memory control circuit 312 through a bus 342. An active low Chip Select signal on signal line 344 enables the controller integrated circuit 310 for either read or write operation. The active low read data signal RD on a signal line 346 in conjunction with the CS signal causes data from a specified register within the memory control circuit 312 to be moved to a data bus AD provided by the bus 352, as indicated. The microprocessor address/data bus AD (7:0) is an input/output bus with active high signals provided on bidirectional signal lines which interface to a multiplexed microprocessor address/data bus of the external microprocessor. A active low write data signal WR on a signal line 348 in connection with the CS signal causes data from the data bus AD to be moved to a specified register within the memory control unit 312. An interrupt request signal IRQ is an active low output signal from the microprocessor interface interrupt control circuit 356 to interrupt the external microprocessor. A clock control circuit 358 within the integrated circuit 310 provides appropriate clocks to a clock bus 360 to the microprocessor interface circuit 340. Signals from the microprocessor interface circuit 340 to the formatter 314 are provided on a bus 362. A SCSI interface circuit 370 provides for communication on a SCSI bus to a memory control unit 312. The active low input/output signal lines in DB(7:0) are the SCSI data lines. An active low input/output busy SCSI control signal BSY is provided on a signal line 374. An active low input/output SCSI SEL control signal is provided on a signal line 376. An active low input/output command/data SCSI control signal C/D is provided on a signal line 378. An active low input/output message SCSI control signal is provided on line 380. An active low pseudo sync in gate control signal PSIG is as provided on signal line 382. An active low input/output request signal REQ in connection with an acknowledged active low input/output signal ACK on line 386 forms a SCSI data transfer handshake. An active low input/output SCSI attention control signal ATN is provided on signal line 388. An active low input/output SCSI reset signal is provided on a signal line 390. All of the above SCSI control signals are provided in accordance with the SCSI standards. The SCSI interface circuit 370 is coupled to the memory control circuit 312 through a signal bus 392.

A DRAM buffer memory interface circuit 400 is coupled to the memory control circuit 312 through a signal bus 401. External connections from the DRAM interface circuit 400 to a DRAM memory (similar to the external DRAM memory 102 of FIGS. 3 and 4) are provided through various signal lines. An active low output row address strobe signal RAS on a signal line 402 provides an address strobe for the DRAM memory. An active low input/output column address strobe signal CAS on a signal line 404 provides an address strobe for a first or an only DRAM. A second active low output column address strobe CAS2 signal on a signal line 406 provides an address strobe for a second DRAM. An active low output write strobe signal W is provided on a signal line 408. An active low output enable signal G on a signal line 410 is a DRAM output driver enable signal. An address bus 412 provides nine bits of DRAM address A(8:0). Note that address signal A7 and A8 of FIGS. 3 and 4 are part of the address information A(8:0). Active high input/output signals are provided on a DRAM data bus DO(3:0), which interfaces with the read data buffers 50 of FIGS. 3 and 4.

Figure 9:
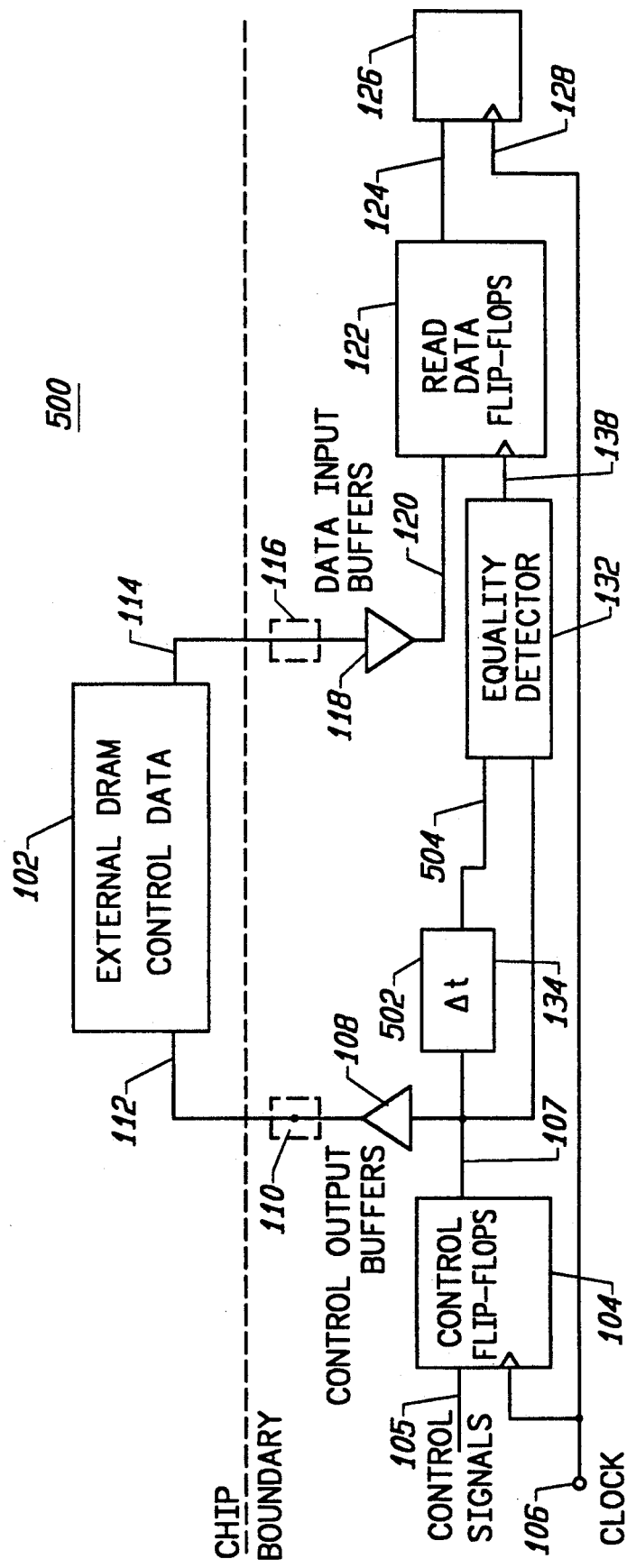
FIG. 9 is a simplified block diagram of a read clocking system similar to FIG. 3 where a generalized delay circuit is used.

FIG. 9 shows a simplified schematic diagram of a clocking system 500, similar to the system 100 of FIG. 3, where like components have the same reference numerals. A generalized delay circuit 502 has its input terminal connected to the output terminal of the control flip-flops 104 and the input terminal of the control output buffers 108, as shown. The output terminal of the delay circuit 502 is connected through a signal line 504 to an input terminal of the equality detector 132. The delay circuit in conjunction with the equality detector 132 provides for delaying, or skewing the read-memory clock on line 138 for a time corresponding to the propagation delay through the control-signal buffers 108 and the propagation delay through the read-data input buffers 118.

The skewing of the read-memory clock in accordance with the invention is particularly useful in a controller system used with a hard-disk magnetic storage device. For a given buffer memory having a certain access-time specification, the invention provides for faster access to a disk-memory by decreasing the access time to the buffer memory.

The invention as described in detail in connection with FIGS. 3, 4, 5, 6, and 7 permits the external DRAM memory, which interfaces with the DRAM interface unit 400, to be operated at a clock period which approaches the memory access delay time. Delays caused by the buffers and the control signal-line capacitance are significantly reduced by skewing the read-memory clock in accordance with the invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. In a controller for interfacing between a magnetic disk-drive memory device and a host computer, a buffer memory subsystem having a buffer memory and a clock system for skewing a memory-read clock for latching a memory data signal into a read-data latch, said memory data signal being received from the buffer memory device, the clock system comprising:

a buffer memory device including a dynamic random access memory, having a control-signal input terminal and a data-signal output terminal;

a control-signal buffer, having an input terminal for receiving an input control signal and having an output terminal coupled to the control-signal input terminal of said buffer memory device;

a read-data buffer, having an input terminal coupled to the data-signal output terminal of said buffer memory device;

read-data latch means, having a data input terminal coupled to the output terminal of said read-data buffer, having an output terminal, and having a clock input terminal, for latching a data signal received from said memory device through said read-data buffer;

means for delaying a clock input signal for said read-data latch means, including:

a sense buffer, having an input terminal coupled to the output terminal of the control-signal buffer and having an output terminal;

equality-detection means for comparing the input control signal with the output signal of the sense buffer and for providing a read-memory clock output signal for the read-data latch means when the input control signal and the output signal of the sense buffers are at the same state to thereby provide the read-memory clock signal skewed for a time corresponding to the propagation delay through the control-signal buffer to the control-signal input terminal of the memory and the read-data input buffer.

2. A system for skewing a memory-read clock for latching a memory data signal into a read-data latch, said memory data signal being received from a memory device having a control-signal input terminal and data-signal output terminal, the system comprising:

a control-signal buffer, having an input terminal for receiving an input control signal and having an output terminal coupled to the control-signal input terminal of said memory device;

a read-data buffer, having an input terminal coupled to the data-signal output terminal of said memory device;

read-data latch means, having a data input terminal coupled to the output terminal of said read-data buffer, having an output terminal, and having a clock input terminal, for latching a data signal received from said memory device through said read-data buffer;

means for delaying a clock input signal for said read-data latch means, including:

a sense buffer, having an input terminal coupled to the output terminal of the control-signal buffer and having an output terminal;

equality-detection means for comparing the input control signal with the output signal of the sense buffers and for providing a read-memory clock output signal for the read-data latch means when the input control signal and the output signal of the sense buffers are at the same state to thereby provide the read-memory clock signal skewed for a time corresponding to the propagation delay through the control-signal buffer to the control-signal input terminal of the memory device and the read-data input buffer.

3. A system for providing a skewed clock signal, which is used for latching a data signal received from a memory into a read-data latch, said memory having a control-signal input terminal and a data output terminal, said system comprising:

control signal latch means, having a clock input terminal for receiving a read clock signal from a read-clock source, having an input terminal for receiving a control-signal, and having an output terminal, for latching said control signal at an output terminal thereof;

a control-signal buffer, having an input terminal coupled to the output terminal of said control signal latch means and having an output terminal coupled to the control-signal input terminal of said memory;

a read-data buffer, having an input terminal coupled to the data output terminal of said memory and having an output terminal, said read data buffer having a signal propagation delay;

a sense buffer, having an input terminal coupled to the output terminal of said control-signal buffer and having an output terminal, said sense buffer having a signal propagation delay approximately matching the signal propagation delay of said read-data buffer;

read-data latch means, having a data input terminal coupled to the data output terminal of said read-data buffer, having an output terminal, and having a clock input terminal, for latching data signals received from said memory;

read-clock delay means, having one input terminal coupled to the output terminal of said control signal latch means, having another input terminal coupled to the output terminal of said sense buffer, and having an output terminal coupled to the clock input terminal of said read-data latch means, for delaying the read clock signal a period of time approximately equal to the signal propagation delay time of the read data buffer and the propagation delay time associated with transmitting a signal from the output terminal of said control signal latch means to the control-signal input terminal of said memory, including the propagation delay time associated with a signal line between the output terminal of said read-data buffer and the control-signal input terminal of said memory.

4. The system of claim 3 wherein the read-clock delay means includes:

equality-detection means for comparing the output signal of the control-signal latch means with the output signal of the sense buffer and for providing a read-clock signal to the clock input terminal of the read-data latch means when the output signal of the control-signal latch means and the output signals of the sense buffer are at the same state.

5. The system of claim 4 wherein said equality-detection means includes logic means for comparing the output signal of the control-signal latch means with the output signal of the sense buffer to provide a delayed read-clock signal to said read-data latch means.

6. The system of claim 4 wherein said equality-detection means includes exclusive-nor logic means for comparing the output signal of the control-signal latch means with the output signal of the sense buffer.

7. The system of claim 3 including a plurality of control signal latch means, control-signal buffers, and sense buffers for accommodating a plurality of control signals for said memory.

8. The system of claim 3 including a plurality of read-data buffers and read-data latch means for accommodating a plurality of data output terminals for said memory DRAM.

9. The system of claim 3 wherein said memory is a dynamic random access memory and said control signal is a column access select CAS signal.

10. A system for skewing a memory-read clock for latching a memory data signal into a read-data latch, said memory data signal being received from a memory device having a control-signal input terminal and data-signal output terminal, the system comprising:

a control-signal buffer, having an input terminal for receiving an input control signal and having an output terminal coupled to the control-signal input terminal of said memory device;

a read-data buffer, having an input terminal coupled to the data-signal output terminal of said memory device;

read-data latch means, having a data input terminal coupled to the output terminal of said read-data buffer, having an output terminal, and having a clock input terminal, for latching a data signal received from said memory device through said read-data buffer;

delay means for delaying a clock input signal for said read-data latch means and providing a read-memory clock signal, said clock signal skewed for a time corresponding to the propagation delay through the control-signal buffer and the propagation delay through the read-data input buffer.

11. The system of claim 10 wherein the delay means has an input terminal coupled to the input terminal of the control-signal buffer and an output terminal coupled to the clock input terminal of said read-data latch means.

12. The clock system of claim 10 wherein said means for delaying the clock input signal for said read-data latch means, includes:

a sense buffer, having an input terminal coupled to the output terminal of the control-signal buffer and having an output terminal; and equality-detection means for comparing the input control signal with the output signal of the sense buffers and for providing a read-memory clock output signal for the read-data latch means when the input control signal and the output signal of the sense buffers are at the same state to thereby provide the read-memory clock signal, said clock signal skewed for a time corresponding to the propagation delay through the control-signal buffer to the control-signal input terminal of the memory and the read-date input buffer.

13. A method for skewing a memory-read clock sign which is used for latching a memory data signal into a read-data latch, where the memory data signal is received from a memory device having a control-signal input terminal and data-signal output terminal, the method comprising the steps of:

passing a control signal through a control-signal buffer, having an input terminal and having an output terminal coupled to the control-signal input terminal of said memory device;

passing a memory data signal through a read-data buffer, having an input terminal coupled to the data-signal output terminal of said memory device;

latching the output signal of said read-data buffer in a read-data latch, having a data input terminal coupled to the output terminal of said read-data buffer, having an output terminal, and having a clock input terminal;

passing the output signal of the control-signal buffer through a sense buffer, having an input terminal coupled to the output terminal of the control-signal buffer and having an output terminal; and comparing the output signals of the control-signal latch with the output signal of the sense buffer and providing a read-memory clock output signal for the read-data latch when the output signal of the control-signal latch means and the output signal of the sense buffers are at the same state to thereby provide the read-memory clock signal skewed for a time corresponding to the propagation delay time through the control-signal buffer and the read-date input buffer.

14. The method of claim 13 including the step of latching an input control signal in a control-signal latch means, having a clock input terminal for receiving a read clock signal from a read-clock source, having an input terminal for receiving a control-signal, and having an output terminal at which is provided a latched control signal.

* * * * *